United States Patent [19]
Goel et al.

[11] Patent Number: 4,681,430
[45] Date of Patent: Jul. 21, 1987

[54] METHOD FOR FOCUSING PROJECTION PRINTER

[75] Inventors: Atul Goel; Keith G. Bartlett, both of Ft. Collins, Colo.; W. R. Trutna, Atherton, Calif.

[73] Assignee: Hewlett-Packard Company, Palo Alto, Calif.

[21] Appl. No.: 900,662

[22] Filed: Aug. 27, 1986

[51] Int. Cl.$^4$ .............................................. G03B 27/32
[52] U.S. Cl. ...................................... 355/77; 355/53; 355/132
[58] Field of Search ................... 355/132, 53, 77, 55, 355/56

[56] References Cited

U.S. PATENT DOCUMENTS 3,411,905 11/1968 Mooney et al. ..................... 355/132
3,877,810 4/1975 Feldstein ............................. 355/132
4,231,657 11/1980 Iwamatsu ............................. 355/77
4,405,229 9/1983 Mayer ................................... 355/53
4,437,758 3/1984 Suzuki .................................. 355/53

Primary Examiner—Monroe H. Hayes
Attorney, Agent, or Firm—Bloor Redding

[57] ABSTRACT

An improved method for automatically focusing an integrated circuit manufacturing projection step and repeat photolithography printer employing an optical signal to focus the printer is disclosed. The automatic focusing is achieved by reflecting an optical signal off a photoresist layer on the surface of a wafer and converting the reflected optical signal into an electronic signal employed to focus the printer. According to the preferred embodiment of the present invention, a dye which absorbs light at the wavelength the optical signal is added to the photoresist layer to improve the quality of the reflected optical signal thereby considerably reducing or eliminating focusing errors.

4 Claims, 2 Drawing Figures

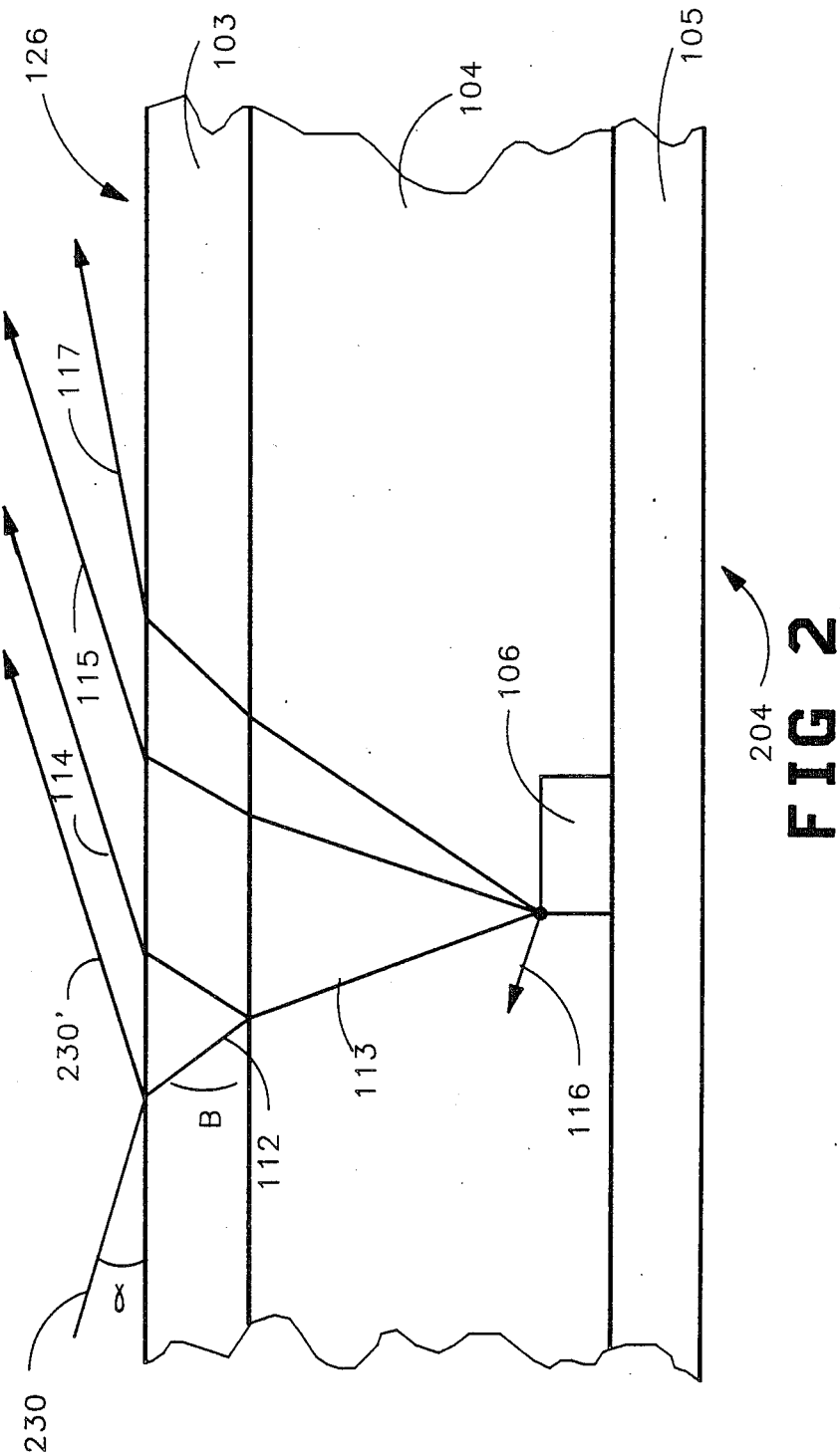

METHOD FOR FOCUSING PROJECTION PRINTER

BACKGROUND

1. Field of Invention

This invention relates generally to the field of integrated circuit manufacturing and in particular to a method for focusing the projection step and repeat photolithography printer employed in a photoresist masking step of an integrated circuit manufacturing process.

2. Description of the Prior Art

A manufacturable, high resolution photoresist process is essential for the development of VLSI circuits. Single layer photoresist processes known in the art are capable of fine resolutions when used with smooth, low reflectivity substrates. Unfortunately, the process of manufacturing integrated circuits creates a complex multi-layered surface of widely varying reflectivities. In response to these problems, several complex photoresist processes have been developed.

One such process is the portable conformal mask process. This process employs a two layer photoresist. The first step of the process is to apply the photoresist layers. The first photoresist layer is typically a polymethyl methacrylate (PMMA) photoresist and is applied in a manner which planarizes the substrate. The second photoresist layer is a standard photoresist layer and is applied in a manner which forms a layer having uniform thickness. Then, the second photoresist layer is exposed using a projection step and repeat photolithography printer. This printer, also referred to as a mask aligner or wafer stepper, exposes the second photoresist layer with monochromatic or quasi-monochromatic light through a master reticle containing the pattern to be constructed. The second photoresist layer is then developed. The developed second photoresist acts as the mask for the first photoresist layer as it is exposed. The first photoresist layer is then developed to form a photoresist mask and the second photoresist layer is usually removed. With the photoresist mask in place, the chemical processing begins and the necessary circuit formations are constructed.

A critical step in the above process is the exposure of the second photoresist layer by the projection printer. The master reticle used by the projection printer to expose the second photoresist layer is typically many times the size of the image to be formed on the photoresist, consequently, a reduction lens is employed to reduce the size of the projected image. In order for the fine lines, typically one to two microns in width, to be formed, the projected image must be precisely focused on the top of the second resist layer. The top of the second layer is referred to as the image plane. Since the images involved are so small, optimum focus is maintained during the exposure of the photoresist layer through the use of an automatic focusing system which compensates for variations in the thickness of the photoresist layers and a standard wafer.

Typical automatic focusing techniques employ an opto-electrical system which reflects an optical signal off the image plane to determine focus and adjusts the distance between the reduction lens and the image plane accordingly thereby focusing the image. A typical automatic focusing system comprises an optical transmitter, an optical receiver and control circuitry. The optical transmitter comprises one or more infra-red light emitting diodes which generate an optical signal with a wavelength of 800 nm to 900 nm. The optical signal is typically modulated or the multiple diodes are sequenced to generate a phase shifted signal. This optical signal reflects off the surface of the wafer into the optical receiver where the optical signal is converted into an electronic signal. The electric signal is fed into the control circuit to generate an error signal which is used to focus the reduction lens.

Ideally, the optical signal entering the optical receiver is generated by reflecting only off the image plane. However, despite a shallow angle of incidence, a portion of the optical signal will enter the second photoresist layer to be reflected by the boundary between the first and second photoresist layers and by circuit formations on the surface of the wafer. These reflections ultimately reach the optical receiver where they are also converted to electronic signals and appear as noise on the main focusing electronic signal. This noise causes the focusing system to incorrectly focus the reduction lens which inturn causes the resist to be improperly exposed. Poor focus is a major source of defects in integrated circuit manufacturing process.

Prior art solutions have attempted to increase the signal to noise ratio of the optical signal by using more powerful light emitting diodes with a narrower emission spectrum, by reducing the diameter of the optical signal or by increasing the angle of incidence. Each of these attempted solutions has failed to resolve the problem of maintaining the very narrow line widths with the high degree of uniformity and accuracy demanded by VLSI integrated circuits.

SUMMARY

In accordance with the preferred embodiment of the present invention, an improved method is provided for automatically focusing the reduction lens of a projection step and repeat photolithography printer. The method involves adding a dye to the photoresist layer which is being exposed. The dye is selected to absorb a narrow range of wavelengths corresponding to the optical signal employed in the automatic focusing system. Eliminating the optical signals reflected from photoresist layers and formations below the image plane substantially improves the signal to noise ratio of the electronic signal generated by the optical receiver and thereby eliminates a major source of error in the automatic focusing system.

The primary objective of the present invention, therefore, is to eliminate the optical signals reflected from photoresist layers and formations below the surface of the photoresist layer being exposed.

Another object of the present invention is to provide a method which is compatible with a wide variety of automatic focusing systems employing the reflected optical signal technique.

A further object of the present invention is to provide a method which is compatible with existing integrated circuit manufacturing processes.

When compared to the prior art, the preferred embodiment of the present invention is novel in its method for significantly reducing or eliminating the undesirable reflections generated when the optical signal is reflected off the surface of the photoresist.

DESCRIPTION OF DRAWINGS

FIG. 2 is a cross sectional view of a wafer which is being exposed to the optical signal of an automatic focusing system.

DESCRIPTION OF PREFERRED EMBODIMENT

Figure 1:
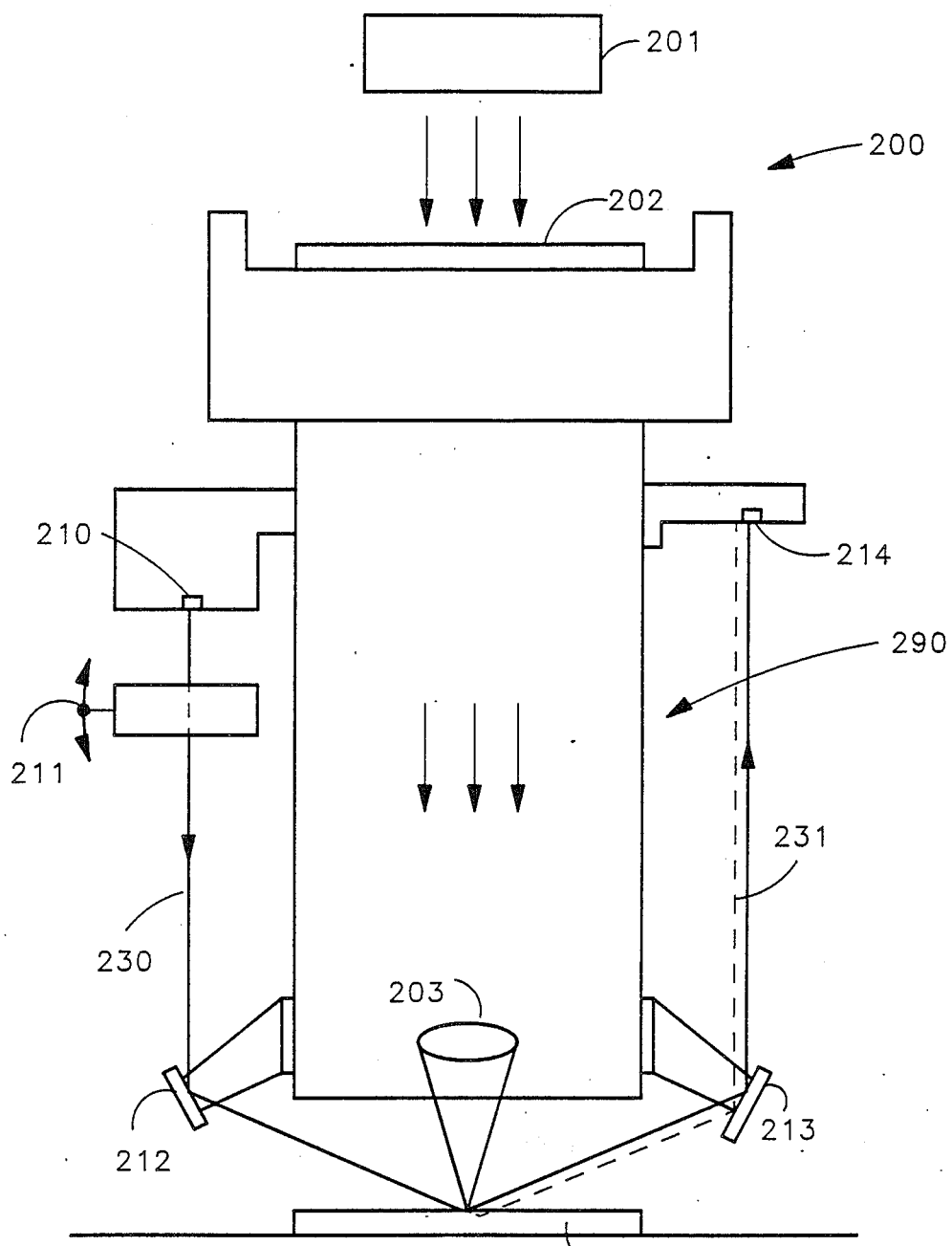
FIG. 1 illustrates a projection step and repeat photolithography printer employing an automatic focusing system in accordance with the preferred embodiment of the present invention.

FIG. 1 illustrates a projection step and repeat photolithography printer employing an automatic focusing system in accordance with the preferred embodiment of the present invention. The projection printer 200 comprises a projection lamp 201, master reticle 202, optical column 290, reduction lens 203 and the automatic focus system. The automatic focus system comprises an optical transmitter 210, optional refractor lens 211, mirrors 212 and 213, optical receiver 214 and control circuitry. Several different techniques may be employed to automatically focus the projection equipment and the present invention is compatible with most of these techniques.

One method of focusing which is compatible with the preferred embodiment of the present invention reflects an optical signal off the surface of the photoresist layer on the wafer and into an optical receiver which converts the signal into electronic signals used to focus the printer. As illustrated in FIG. 1, the optical transmitter 210 transmits an optical signal through an optional refractor block 211 to mirror 212. The mirror 212 reflects the optical signal 230 onto the surface of the photoresist layer at a shallow angle of incidence. The optical signal should strike the photoresist layer in the center of the area where the reduced image from the reduction lens is to be focused and the optional refractor block 211 may be used to precisely adjust this position. The optical signal then reflects off the surface of the photoresist layer to mirror 213. Mirror 213 reflects the optical signal into the optical receiver 214. The optical receiver 214 converts the optical signal into an electronic signal which is fed to a control circuit which inturn is connected to a motor. The motor raises and lowers the optical column, or the wafer table in some configurations, to focus the reduction lens. If the projection equipment is out of focus, as illustrated in FIG. 1 by optical signal 231, the reflected optical signal will not be centered on the optical receiver. This condition is detected and used to focus the projection printer.

Once the projection equipment is properly focused, the projection lamp 201 is activated. The light generated by the lamp passes through the master reticle 202 containing a positive image of the photoresist mask to be created and through the reduction lens 203 before striking the surface of the photoresist layer. The photoresist material is sensitive to the wavelength of the projection lamp 201. After exposure, the photoresist is developed into a mask which is employed in the next stage of the integrated circuit manufacturing process. In order for the process to operate properly, the optical signal 230 must be at a wavelength which is different from the wavelength of the projection light, i.e. a wavelength at which the photoresist is not sensitive.

FIG. 2 is a cross sectional view of the wafer 204 which is being exposed to the optical signal 230 of an automatic focusing system. The wafer 204 comprises a substrate 105, a first photoresist layer 104, and a second photoresist layer 103. A formation 106 from a previous step of the manufacturing process which is approximately one micron in width is shown. The optical signal 230 approaches a surface 126 of the second photoresist layer 103 at a small angle of incidence, alpha. The surface 126 is also referred to as the image plane. The optical signal is reflected off the surface 126 as signal 230'. The signal 230' is reflected back to the optical receiver where it is converted into an electronic signal, typically by a photodiode. In addition to optical signal 230 being reflected as generated signal 230', the optical signal 230 is also refracted to form signal 112. The signal 112 enters the photoresist layer rather than being reflected off the surface 126. The boundary between the first and second photoresist layer reflects a portion of signal 112 back into the second photoresist layer and on to the optical receiver as optical signal 114. The remainder of the signal 112 is refracted again by the boundary between the first and second photoresist layer to form signal 113. The optical signal 113 passes through the first photoresist layer until it strikes the substrate 105 or formation 106. If the signal strikes the substrate 105, it reflects back through the photoresist layers and onto the optical receiver. If the signal strikes the formation 106, whose size is approximately the wavelength of the optical signal 230, the optical signal 113 will be dispersed as shown by optical signals 115, 116 and 117. Signals 115 and 117 pass through the photoresist layers and onto the optical receiver. When optical signals other than 230' reach the optical receiver, the system appears to be out of focus, which is in error. The preferred embodiment of the present invention significantly reduce these reflections by significantly attenuating or eliminating the optical signal 112, 114, 115 and 117. This is achieved by adding a dye to the second photoresist layer which absorbs light at the same wavelength as the optical signal employed in the automatic focusing system, but not at wavelengths at which the second photoresist is sensitive. The dye absorbs the reflected signals 112, 114, 115, 117 thus preventing these optical signals from reaching the optical receiver and causing the erroneous out of focus condition.

For the most efficient operation, 95% or more of the optical signal entering the photoresist layer 103 should be absorbed during the trip into and back out of the photoresist layer. The quantity of dye required may be calculated as follows. The amount of optical signal power absorbed by the dye is given by the eqution:

$$I = I_o e^{-1}$$

where I in the power of the optical signal after passing through the dye and $I_o$ is the power of the optical signal before passing through the dye and a is the absorption. For most efficient operation, $I/I_o = 0.05$. Absorption may be calculated using the following equation:

$$a = Elc$$

where E is the extinction coefficient of the dye and l is the path length through the photoresist and c is the concentration of the dye. Snell's law may be used to calculate the path length and the maximum absorptivity may be used as the extinction coefficient.

The preferred embodiment of the present invention was developed for the GCA DSW 4800 projection step and repeat photolithography printer by adding an infrared absorbing dye to the photoresist layer. The automatic focusing system of the GCA printer employs the above technique. The optical source for the GCA printer comprises two infra-red optical diodes having a wavelength of approximately 800–850 nm. The angle of incidence, alpha, for the GCA printer is approximately 11 degrees.

For a two layer photoresist integrated circuit manufacturing process, the dye is added to the second photoresist layer. The first layer photoresist is applied by spinning DUPONT KTI PMMA onto the wafer and soft baking. Then, the second photoresist layer is applied by spinning the second photoresist material onto the wafer and again soft baking. The second photoresist material comprises 2 grams of infra-red absorbing dye KODAK IR-140 CAS Registry Number 53655-17-7 for every 1 liter of KODAK 809 Photoresist. IR-140 has a maximum absorptivity of $15.60 \times 10^4$ L/cm/mole in DMSO at 823 nm and a molecular weight of 779.21. IR-140 has a maximum absorptivity of approximately $14 \times 10^4$ in KODAK 809. The KODAK and DUPONT photoresists are well known in the art. The remainder of the process is identical to the prior art process including the exposure of the photoresist layers using the GCA printer and the developing of the photoresist layers to form the mask.

An alternate embodiment of the present invention is compatible with single photoresist processes. A suitable photoresist for a single layer photoresist process is constructed using 2 gram of IR-140 for every 1 liter of AZ1470, also a common photoresist.

Additional applications of the present invention are readily apparent to those skilled in the art.

We claim:

1. An improved method for automatically focusing an image through a lens onto a surface having reflective and refractive properties, the focusing method of the type wherein a optical transmitter transmits an optical signal toward the surface and where the optical signal is reflected off the surface to an optical receiver, the optical receiver generating an electronic signal employed to focus the lens, the improvement comprising:
    selecting a dye which strongly absorbs light at the wavelength of the optical signal; and
    dissolving the dye in the surface.

2. An improved method of forming a photosensitive mask of the portable conformal mask type wherein a first photoresist material is deposited on the substrate to produce a bottom photoresist layer having a substantially planar top photoresist surface, a second photoresist material is deposited as a top photoresist layer producing a multilayer substrate coating having the bottom photoresist layer sandwiched between the substrate and the top photoresist layer, the top photoresist layer is exposed with a printer through a mask to expose only selected portions of the top photoresist layer, the top photoresist layer is exposed to light in a range in which the second photoresist is insensitive, the top photoresist layer is exposed to an optical signal in a range in which the photoresist material is insensitive, said optical signal having been reflected off the surface of the top photoresist layer in order to focus the printer, the top photoresist layer is developed to produce a portable conformal mask, and the layers of the substrate coating other than the top photoresist layer are processed to replicate the pattern of this portable conformable mask, and the layers of the substrate coating other than the top photoresist layer are processed to replicate the pattern of this portable conformal mask into such layers, the improvement comprising:
    selecting a dye which strongly absorbs light at the wavelength of the optical signal; and
    dissolving the dye in the first photoresist material.

3. A method as in claim 2 further comprising the step of disolving the dye in the second photoresist material.

4. An improved method of forming a photosensitive mask of the type wherein a photoresist material is deposited on the substrate to produce a photoresist layer, the photoresist material is exposed with a printer through a mask to expose only selected portions of the photoresist layer, the photoresist layer is exposed to an optical signal in a range in which the photoresist material is insensitive, said optical signal having been reflected off the surface of the photoresist material in order to focus the printer, exposing the photoresist layer with a light in which the photoresist material is sensitive, developing the photoresist layer to produce a mask, the improvement comprising:
    selecting a dye which strongly absorbs light at the wavelength of the optical signal; and
    dissolving the dye in the photoresist material.

* * * * *

UNITED STATES PATENT AND TRADEMARK OFFICE
CERTIFICATE OF CORRECTION

PATENT NO. : 4,681,430

DATED : July 21, 1987

INVENTOR(S) : Atul Goel, Keith G. Bartlett, W. R. Trutna

It is certified that error appears in the above-identified patent and that said Letters Patent is hereby corrected as shown below:

Column 4, line 50, "I=Ioe-1" should read -- $I = I_0 e^{-a}$ --.

Signed and Sealed this

Twelfth Day of March, 1991

Attest:

HARRY F. MANBECK, JR.

Attesting Officer

Commissioner of Patents and Trademarks